US008638892B2

(12) United States Patent
Dabiri et al.

(10) Patent No.: US 8,638,892 B2
(45) Date of Patent: Jan. 28, 2014

(54) ADAPTIVE NARROWBAND INTERFERENCE PREDICTION CIRCUIT AND METHOD

(75) Inventors: Dariush Dabiri, San Jose, CA (US); Maged F. Barsoum, Saratoga, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 404 days.

(21) Appl. No.: 12/952,184

(22) Filed: Nov. 22, 2010

(65) Prior Publication Data

US 2012/0014487 A1    Jan. 19, 2012

Related U.S. Application Data

(60) Provisional application No. 61/399,720, filed on Jul. 14, 2010.

(51) Int. Cl.
*H04B 1/10* (2006.01)
(52) U.S. Cl.
USPC ........... 375/350; 375/232; 375/233; 375/297; 375/343; 375/346
(58) Field of Classification Search
USPC .................. 375/350, 232, 233, 297, 343, 346
See application file for complete search history.

(56) References Cited

U.S. PATENT DOCUMENTS

| 5,694,437 | A * | 12/1997 | Yang et al. ................... 375/346 |
| 6,751,255 | B1 * | 6/2004 | Reuven et al. ............... 375/233 |
| 6,904,443 | B2 | 6/2005 | White |
| 6,976,044 | B1 | 12/2005 | Kilani |
| 7,003,094 | B2 | 2/2006 | Fischer et al. |
| 7,741,921 | B2 | 6/2010 | Ismailov |
| 2003/0165205 | A1 | 9/2003 | Chu et al. |
| 2005/0002474 | A1 * | 1/2005 | Limberg ....................... 375/321 |
| 2006/0256898 | A1 * | 11/2006 | Popper et al. ................. 375/346 |
| 2007/0009011 | A1 | 1/2007 | Coulson |
| 2008/0069258 | A1 * | 3/2008 | Arad ............................ 375/260 |
| 2008/0112525 | A1 | 5/2008 | Do et al. |
| 2008/0267392 | A1 | 10/2008 | Raheja et al. |
| 2009/0061808 | A1 | 3/2009 | Higgins |
| 2009/0238102 | A1 | 9/2009 | Dabiri |
| 2009/0252234 | A1 | 10/2009 | Samdani et al. |

OTHER PUBLICATIONS

U.S. Appl. No. 61/399,720, pp. 49.
U.S. Appl. No. 12/952,154, pp. 49.
U.S. Appl. No. 12/952,164, pp. 35.
U.S. Appl. No. 12/952,172, pp. 28.
U.S. Appl. No. 12/952,178, pp. 40.
U.S. Appl. No. 12/952,150, pp. 52.

(Continued)

*Primary Examiner* — Kabir A Timory (57) ABSTRACT

An input signal that includes narrowband interference is spectrally enhanced by an adaptive circuit that supplies as output signal(s), portion(s) of NBI at one or more frequencies that change adaptively. The output signal(s) are used in one or more tone predictor(s) to generate, based on prior values of the NBI portion, one or more predicted tone signals that are subtracted from a received signal containing the NBI, and the result is used in the normal manner, e.g. decoded. The adaptive circuit and the one or more tone predictor(s), form a feed-forward NBI predictor wherein the received signal is supplied as the input signal of the adaptive circuit. The result of subtraction may be supplied to a slicer that slices the result, yielding a sliced signal which is subtracted from the received signal to generate a signal can be used as the input signal, to implement a feedback NBI predictor.

16 Claims, 11 Drawing Sheets (56) References Cited

OTHER PUBLICATIONS

U.S. Appl. No. 12/952,193, pp. 35.

Ungerboeck, G. "10GBASE-T Coding and Modulation: 128-DSQ + LDPC", IEEE P802.3an Task Force, Ottawa, Sep. 29-Oct. 1, 2004, pp. 15.

"802.3an-2006 IEEE Standard for Information Technology—Telecommunications and Information Exchange Between Systems—Local and Metropolitan Area Networks—Specific Requirements, Part 3: Carrier Sense Multiple Access With Collision Detection (CSMA/CD) Access Method and Physical Layer Specifications", Sep. 2006, pp. 167.

Stolle, R. "Electromagnetic Coupling of Twisted Pair Cables", published in IEEE Journal on Selected Areas in Communications, vol. 20, No. 5, Jun. 2002, pp. 883-891.

Nehorai, A. et al., "Adaptive Comb Filtering for Harmonic Signal Enhancement", published in IEEE Transactions on Acoustics, Speech, and Signal Processing, vol. ASSP-34, No. 5, Oct. 1986, pp. 1124-1138.

Nehorai, A. "A Minimal Parameter Adaptive Notch Filter With Constrained Poles and Zeros", published in IEEE Transactions on Acoustics, Speech, and Signal Processing, vol. ASSP-33, No. 4, Aug. 1985, pp. 983-996.

Stoica, P. et al. "Performance Analysis of an Adaptive Notch Filter with Constrained Poles and Zeros", published in IEEE Transactions on Acoustics, Speech, and Signal Processing, vol. 36, No. 6, Jun. 1988, pp. 911-919.

MacLeod, M.D. "Fast Nearly ML Estimation of the Parameters of Real or Complex Single Tones or Resolved Multiple Tones", published in IEEE Transactions on Signal Processing, vol. 46, No. 1, Jan. 1998, pp. 141-148.

* cited by examiner

ADAPTIVE NARROWBAND INTERFERENCE PREDICTION CIRCUIT AND METHOD

CROSS-REFERENCE TO PROVISIONAL APPLICATION

This application claims priority under 35 USC §119 (e) from a provisional application, namely U.S. Application No. 61/399,720 filed on Jul. 14, 2010 having the title "EMI cancellation method and apparatus", filed by Dariush Dabiri, which is incorporated by reference herein in its entirety.

CROSS-REFERENCE TO RELATED APPLICATIONS

This patent application is related to and incorporates by reference herein in their entirety, the following patent applications that are co-owned and concurrently filed herewith:

(1) US Patent Application, entitled "Stabilized Digital Quadrature Oscillator" by Dariush Dabiri et al., Ser. No. 12/952,154;
(2) US Patent Application, entitled "Detection and Estimation of Narrowband Interference By Matrix Multiplication" by Dariush Dabiri, Ser. No. 12/952,164;
(3) US Patent Application, entitled "Confirmation of Presence of Narrowband Interference By Harmonic Analysis" by Dariush Dabiri et al., Ser. No. 12/952,172;
(4) US Patent Application, entitled "Adaptive Spectral Enhancement and Harmonic Separation" by Dariush Dabiri et al., Ser. No. 12/952,178;
(5) US Patent Application, entitled "Narrowband Interference Cancellation Method and Circuit" by Dariush Dabiri, Ser. No. 12/952,150; and
(6) US Patent Application, entitled "Multi-Input IIR Filter with Error Feedback" by Maged F. Barsoum, et al., Ser. No. 12/952,193.

BACKGROUND

In a local area network, a PHY device 12 in a computer 10 (FIG. 1A) may be connected to another PHY device 22 in an Ethernet Switch 20 by use of a cable 32. Cable 32 typically includes four twisted-pair copper conductors 32A-32D (which may be shielded or unshielded) that carry analog signals between four transceivers 12A-12D in PHY device 12 (that in turn is coupled to MAC device 11) and four transceivers 22A-22D in PHY device 22 (that in turn is coupled to MAC device 21). Each of transceivers 12A-12D typically includes a transmit data path and a receive data path in an integrated circuit (IC) die that forms PHY device 12. The transmit data path typically includes an FEC encoder, transmit circuitry, a digital to analog converter, an analog filter, and a line driver, illustrated unlabeled in FIG. 1A. Similarly, the receive data path typically includes corresponding components in a reverse order, e.g. a receive amplifier, an analog filter, an analog to digital converter, receive circuitry and an FEC decoder (also see FIG. 1A).

Figure 1A:
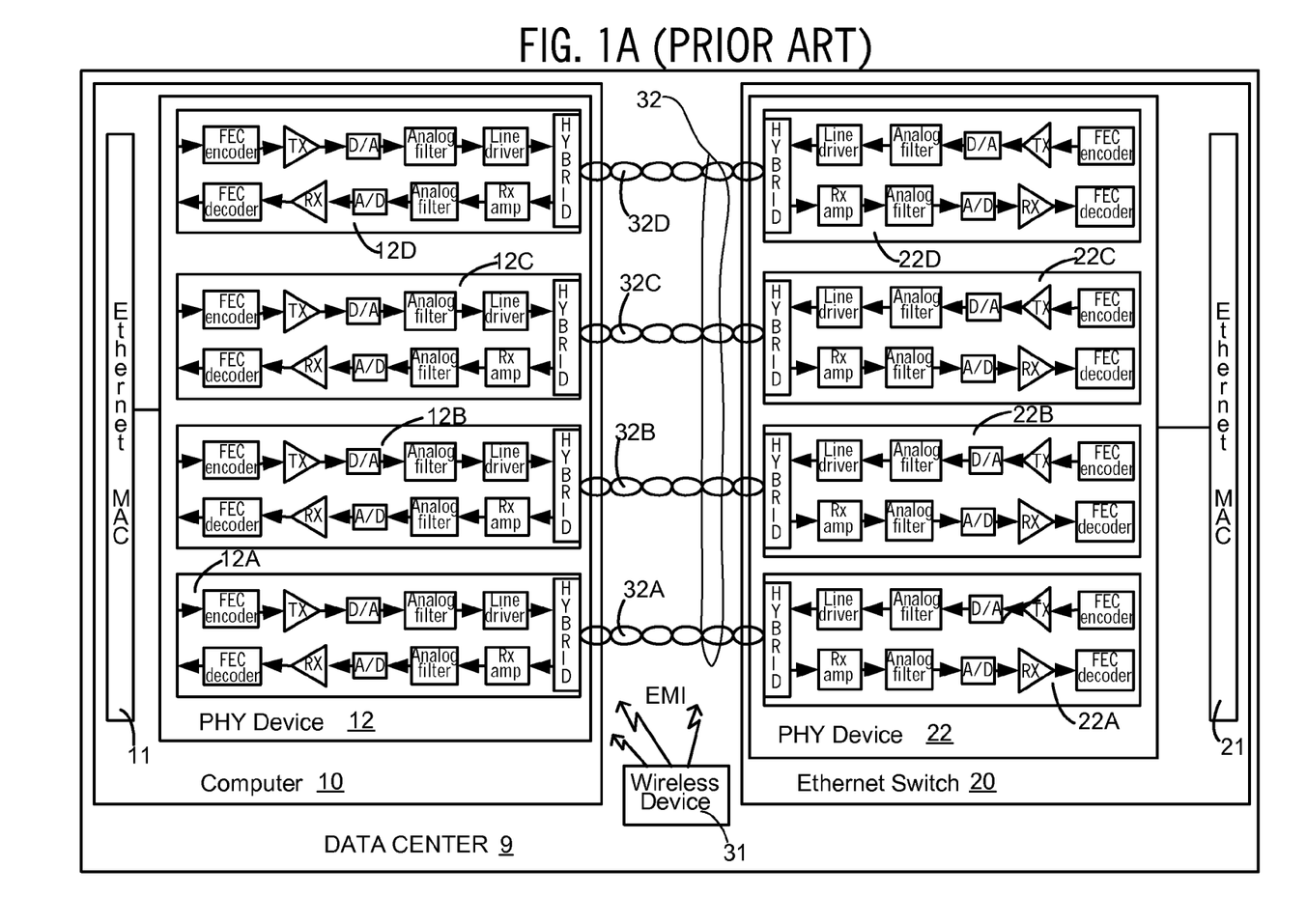
FIG. 1A illustrates, in a high level block diagram, a prior art data center 9 having a computer 10 and an Ethernet switch 20 interconnected by a cable 32, wherein cable 32 experiences electromagnetic interference (EMI) on operation of a wireless device 31.

A signal received from cable 32 by any of transceivers 22A-22D is typically weak, and any degradation affects the bit error rate (BER). Degradation of the signal during transmission across cable 32 occurs for a number of known reasons, such as echo due to reflections in cable 32, near end cross talk (NEXT) and far end cross talk (FEXT) due to the adjacency of conductors in cable 32, attenuation caused by length of cable 32, etc. Such reasons for degradation are internal to a communication channel that is formed between transceivers 12A-12D, 22A-22D by cable 32. Such internally-originated noise depends strictly on the physical characteristics of cable 32 and its connections to transceivers 22A-22D. Several prior art techniques have been developed, to suppress or cancel such internally-originated noise.

The signal transmitted through cable 32 (FIG. 1A) is occasionally further degraded by noise that originates externally ("externally-generated noise"). For example, coupling of electromagnetic energy radiated by a wireless device 31, such as a walkie-talkie typically occurs in cable 32, resulting in noise therein due to electromagnetic interference (EMI). The amount of such EMI noise that gets injected into a signal in cable 32 increases as the distance reduces between wireless device 31 and cable 32. When wireless device 31 is sufficiently close, the EMI noise picked up by cable 32 can so severely corrupt a signal carried therein that a link drop occurs. The amount of EMI noise that is picked up by a signal travelling through cable 32 depends on various characteristics of cable 32, such as shielding and grounding.

Some prior art methods may remove EMI from a signal that is received by any of transceivers 22A-22D by applying spectral analysis directly to the received signal. For further information on spectral analysis of a signal, see the following books: (1) Introduction to Spectral Analysis, by P. Stoica and R. Moses. Prentice Hall, N.J., 1997 and (2) Modern Spectral Estimation: Theory and Practice, by S. M. Kay, Prentice Hall, N.J. 1988. Also see the article entitled "Electromagnetic Coupling of Twisted Pair Cables" by Reinhard Stolle, published in IEEE JOURNAL ON SELECTED AREAS IN COMMUNICATIONS, VOL. 20, NO. 5, JUNE 2002, which is incorporated by reference herein in its entirety. This article provides a theoretical background and supplies simple approximation formulae for prediction of EMI.

To generate a reliable estimate of EMI, several prior art methods of the type described in the preceding paragraph above, require collection of a large amount of data because the interference signal is embedded in the received signal. Depending on the method, the time required to collect such data can become so large as to result in a link drop between the transmitter and the receiver. Hence, the current inventor believes there is a need for detection and estimation of narrow band interference (EMI/RFI), as discussed below.

SUMMARY

In several aspects of the invention, a signal ("input signal") that includes EMI is spectrally enhanced by an adaptive circuit that supplies as one or more output signal(s), one or more portion(s) of the EMI filtered (or in some embodiments bandpass filtered) at one or more frequencies that can be changed adaptively. The output signal(s) is/are then used in one or more tone predictor(s) to generate, based on prior values of the EMI portion(s), one or more predicted tone signals. The predicted tone signal(s) are then subtracted by an arithmetic unit, from a received signal containing the EMI. The result generated by the arithmetic unit is thereafter used in the normal manner, e.g. decoded and supplied to a media access controller (MAC). Therefore, the adaptive circuit, the one or more tone predictor(s), and the arithmetic unit together form a feed-forward noise-predictive narrowband interference canceller, wherein the received signal is supplied as the input signal of the adaptive circuit.

In some aspects of the invention, the result from the arithmetic unit is additionally supplied to a slicer that slices the result, yielding a sliced signal which is subtracted from the received signal by another arithmetic unit, to generate a signal that can be used (e.g. via a switch) as the input signal to the adaptive circuit, thereby to implement a feedback noise-predictive narrowband interference canceler. The switch when opened, results in operation of the circuit as the above-described feed-forward noise-predictive narrowband interference canceler. The adaptive circuit and the tone predictor(s) together form a narrowband interference predictor.

DETAILED DESCRIPTION

A remote signal sent by a transmitter is typically received at a receiver (e.g. included in a transceiver) as a received signal that includes noise, in addition to the remote signal. The noise in the received signal depends on various characteristics of the transmission medium as well as external interference. In some embodiments, the received signal is processed by a Front End Processing Circuit to cancel certain types of noise, such as echo, FEXT and NEXT, e.g. as described in a US Patent Application, with Dariush Dabiri as the first-named inventor, that is concurrently filed herewith, and co-owned as follows:

(1) "Narrowband Interference Cancellation Method and Circuit", Ser. No. 12/952,150.

The just-described patent application is hereby incorporated by reference herein, in its entirety.

Figure 1B:
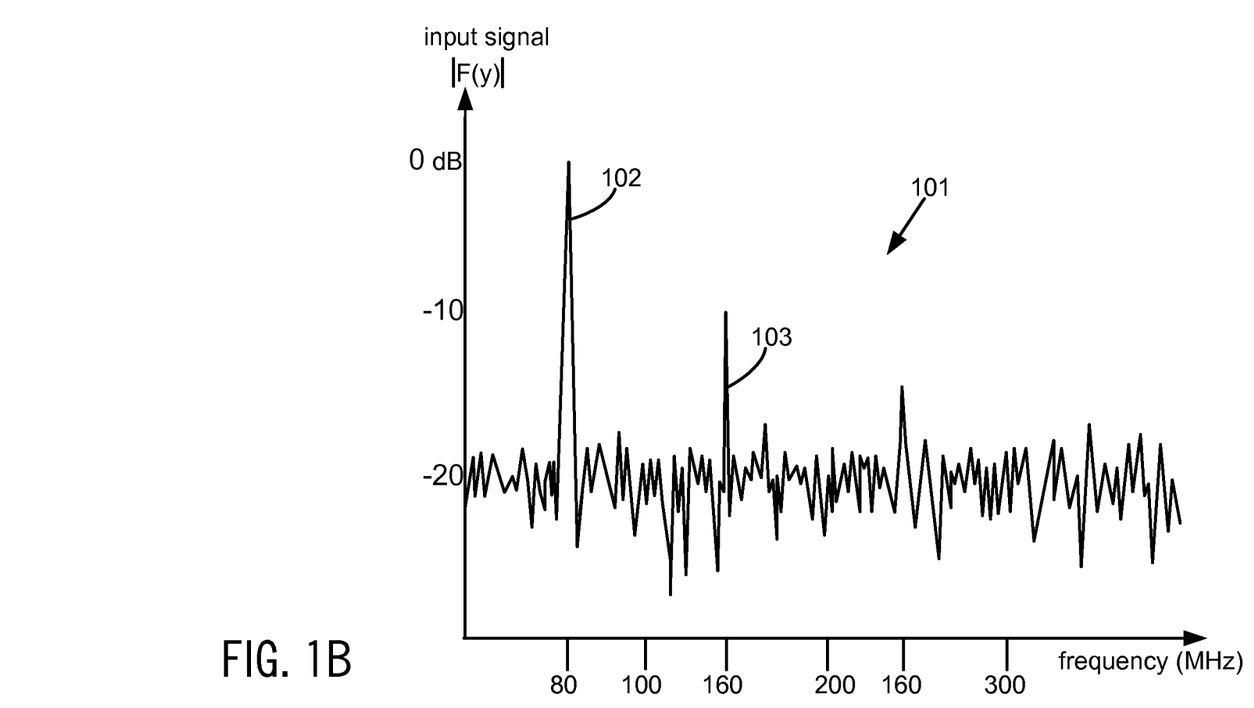
FIG. 1B illustrates, in a graph, a signal that is extracted for noise cancellation in some embodiments of the invention from a signal that is received from a remote transmitter.

In a signal 101 that is generated by such a Front End Processing Circuit, when narrowband interference is present, it may appear as peaks in the frequency domain, e.g. see peaks 102 and 103 illustrated in FIG. 1B. Accordingly, in several aspects of the invention, a circuit (also called "noise-predictive narrowband interference canceler") tracks one or more frequencies of narrowband noise in the form of electromagnetic interference (EMI) in signal 101, and cancels the EMI in signal 101 by adding thereto one or more corresponding predicted signals filtered (or bandpass filtered) at one or more corresponding frequencies $\omega 1$, $\omega 2$ that are estimated from the EMI.

Figure 2A:
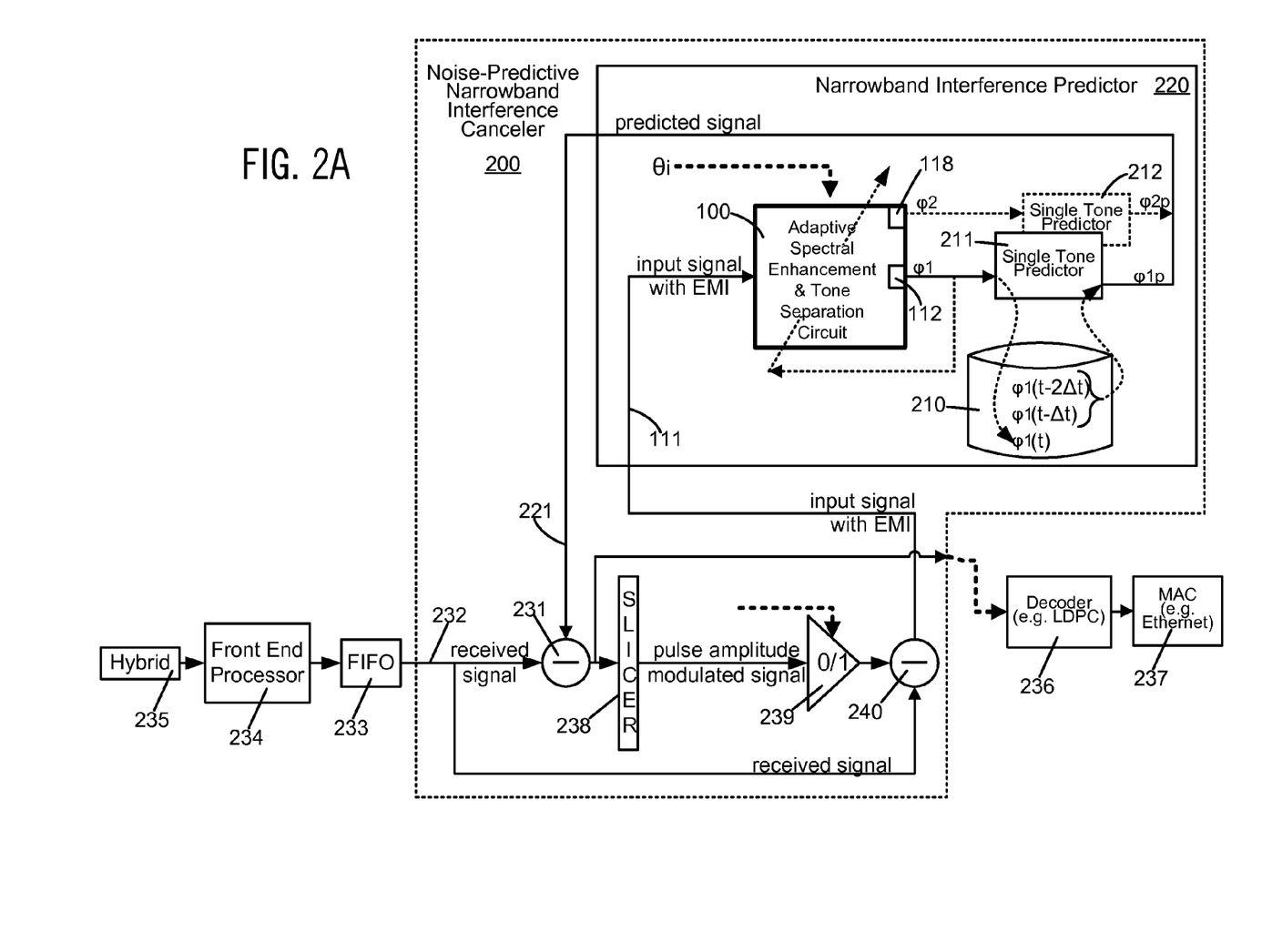
FIG. 2A illustrates, in a high level block diagram, a circuit 200 in accordance with the invention, including an adaptive spectral enhancement and tone separation circuit 100 that generates on a line 221, a predicted signal for use in noise cancellation.

Referring to FIG. 2A, an illustrative noise-predictive narrowband interference canceler 200 includes an adaptive spectral enhancement and tone separation circuit 100 that has an input line 111 to receive thereon an input signal that includes narrowband interference. The input signal on line 111 is spectrally enhanced by the adaptive spectral enhancement and tone separation circuit (also called simply "adaptive circuit") 100. In response to receiving the input signal on line 111, adaptive circuit 100 supplies, as an output signal on an output port 112, a portion $\phi 1$ (or a complement thereof) of the narrowband interference, filtered [or bandpass filtered] at a frequency $\omega 1$ that can be changed adaptively over time. The narrowband interference portion (also called "tone") $\phi 1$ in the output signal (or its complement) on port 112 has a bandwidth that is narrower, e.g. by an order of magnitude than the bandwidth of the input signal on line 111.

Frequency $\omega 1$ that can be changed adaptively over time is initially identified to circuit 100 by a coefficient $\theta i$ that is input to circuit 100. Coefficient $\theta i$ may be generated in any manner that would be readily apparent to the skilled artisan in view of this disclosure. In an illustrative aspect of the invention, coefficient $\theta i$ is generated by a coarse estimator of the type described in either one or both US patent applications, with Dariush Dabiri as the first-named inventor, that are concurrently filed herewith, and co-owned as follows:

(2) "Confirmation of Presence of Narrowband Interference By Harmonic Analysis", Ser. No. 12/952,172; and (3) "Detection and Estimation of Narrowband Interference By Matrix Multiplication", Ser. No. 12/952,164.

The just-described two patent applications are hereby incorporated by reference herein, in their entirety.

Referring to FIG. 2A, an output signal (which includes narrowband interference (NBI) portion $\phi 1$ or its complement) on output port 112 of circuit 100 is used in a tone predictor 211 to generate a predicted tone signal $\phi 1p$ on a line 221. Tone predictor 211 uses two or more prior values of the NBI portion $\phi 1$ (e.g. stored in a buffer 210 at multiple times in the past) to extrapolate the value $\phi 1p$ of the NBI portion $\phi 1$ at the current time t. Depending on the aspect of the invention, any extrapolation method may be used in tone predictor 211, such as an LMS (least mean squared) adaptive prediction method.

In some aspects of the invention, circuit 110 is designed to generate multiple predicted tone signals, to address situations wherein multiple tones of NBI are present in the input signal on line 111 (FIG. 2A). For example if the NBI in the input signal has two spikes (in the frequency domain) at two frequencies, then an additional portion $\phi 2$ (or a complement thereof) of the NBI, at another frequency $\omega 2$ is spectrally enhanced and output by circuit 110 at an additional port 118. The additional output $\phi 2$ (or its complement) is used in an additional tone predictor 212, to generate an additional predicted tone signal $\phi 2p$ also supplied on line 221 (in summation with predicted tone signal $\phi 1p$).

Referring to FIG. 2A, each of tone predictors 211, 212 operates at a single frequency, e.g. tone predictor 211 operates at frequency $\omega 1$ independently of tone predictor 212 operating at frequency $\omega 2$. Moreover, each frequency $\omega 1$, $\omega 2$ can be changed adaptively over time, also independent of each other. As will be readily apparent to the skilled artisan in view of this disclosure, any number of additional predicted tone signals may be generated by a narrowband interference predictor 220 e.g. depending on the number of frequencies of NBI in a particular application.

Depending on the environment, noise in the input signal (on line 111) may be present at multiple unknown frequencies (estimated by circuit 100 to be $\omega 1$, $\omega 2$ etc) that may or may not be independent of each other. In certain aspects of the invention, there are two additional frequencies $\omega 2$, $\omega 3$ which are harmonics (e.g. second harmonic and third harmonic) of an estimated frequency $\omega 1$ (called "fundamental frequency"), and these three frequencies are all identified by circuit 100, for example as described in a concurrently filed, co-owned patent application entitled "Adaptive Spectral Enhancement and Harmonic Separation" filed by Dariush Dabiri, Ser. No. 12/952,178, which is incorporated by reference herein in its entirety.

Figure 3A:
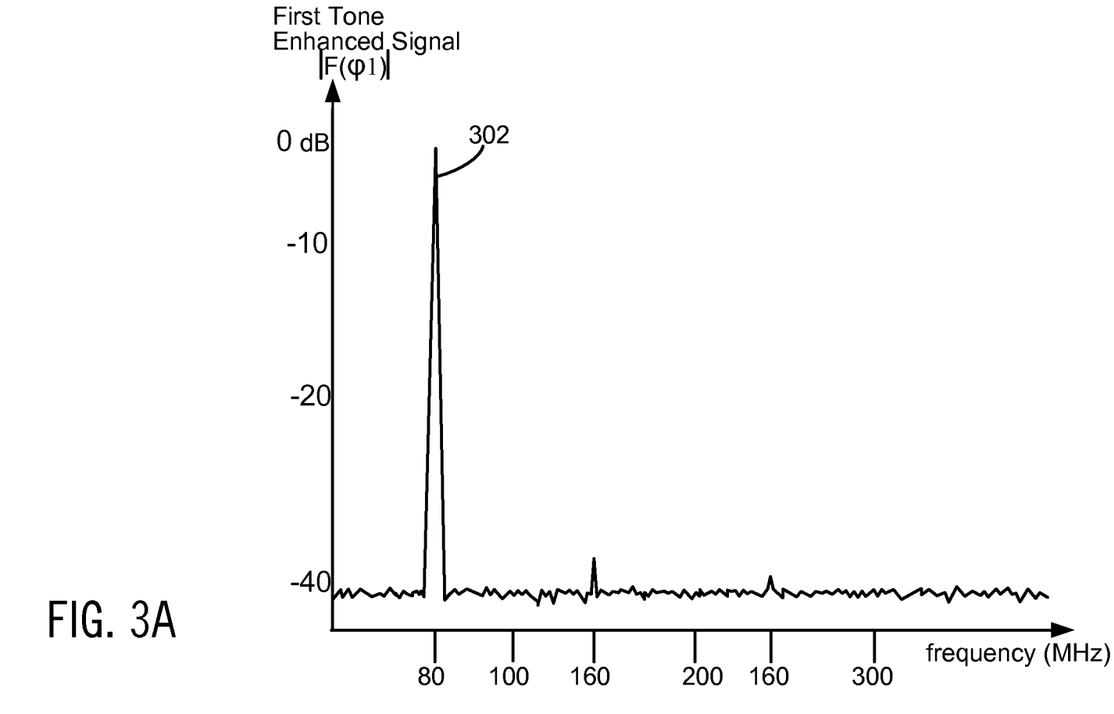
FIGS. 3A-3E illustrate, in graphs, signals in the circuit 100 in some aspects of the invention.
Figure 3B:
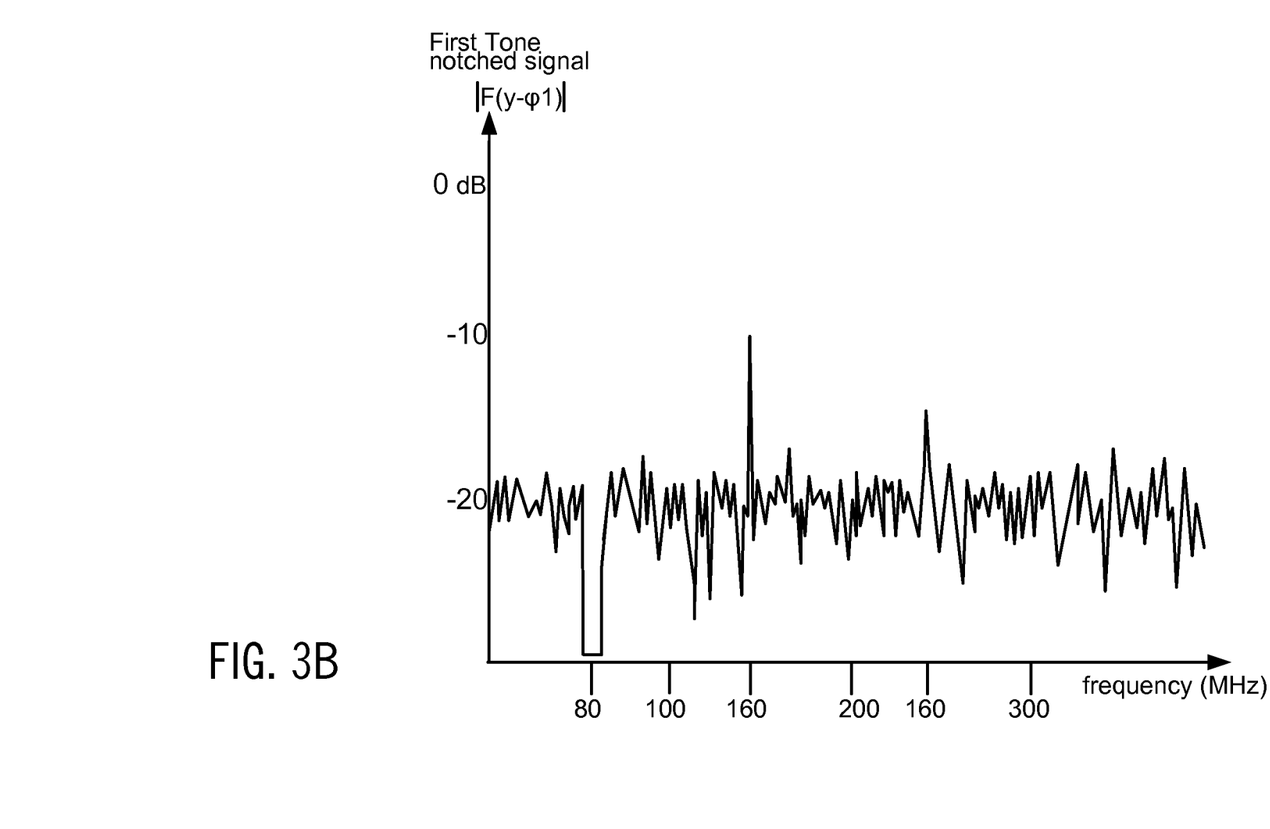
Figure 3C:
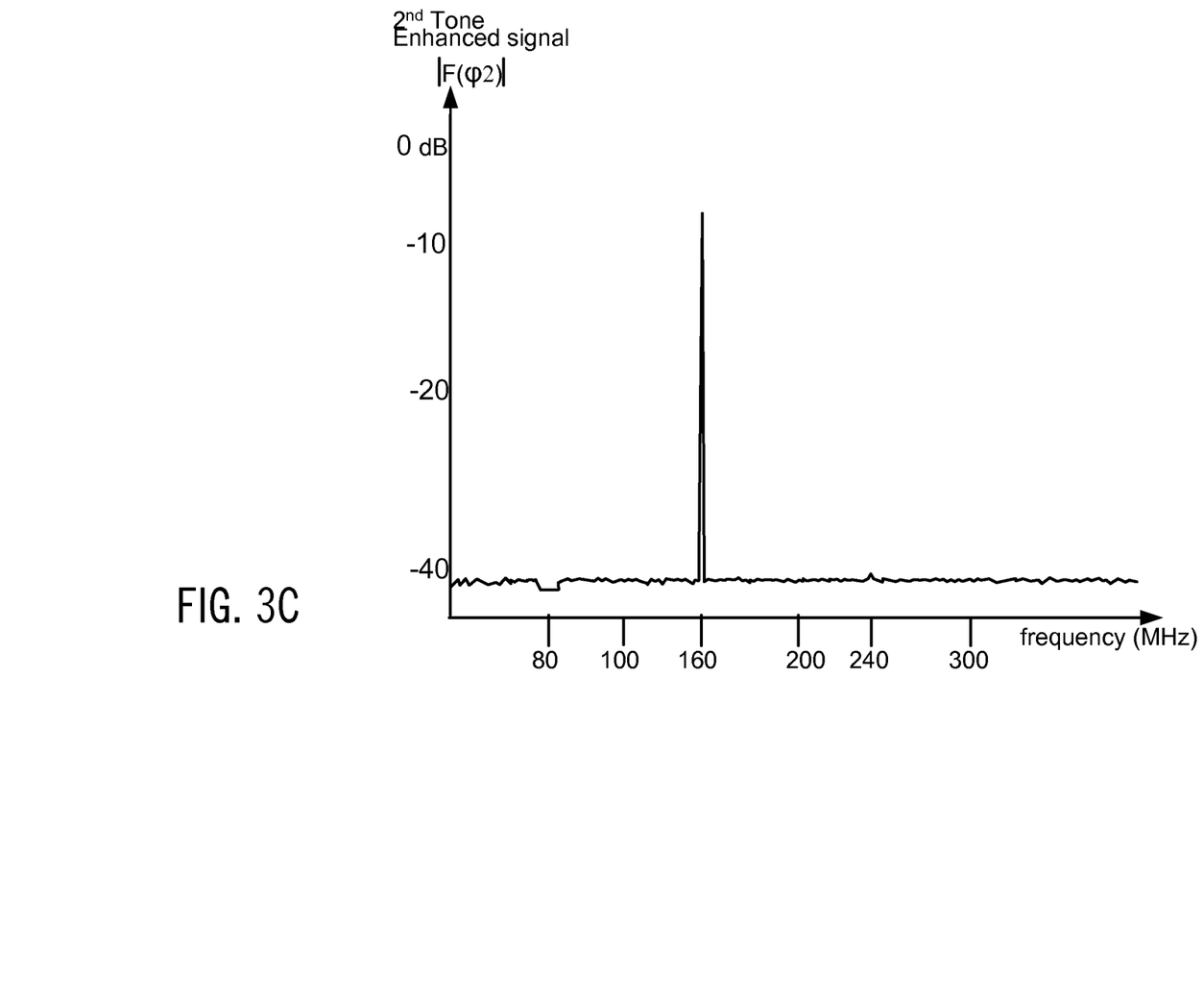
Figure 3D:
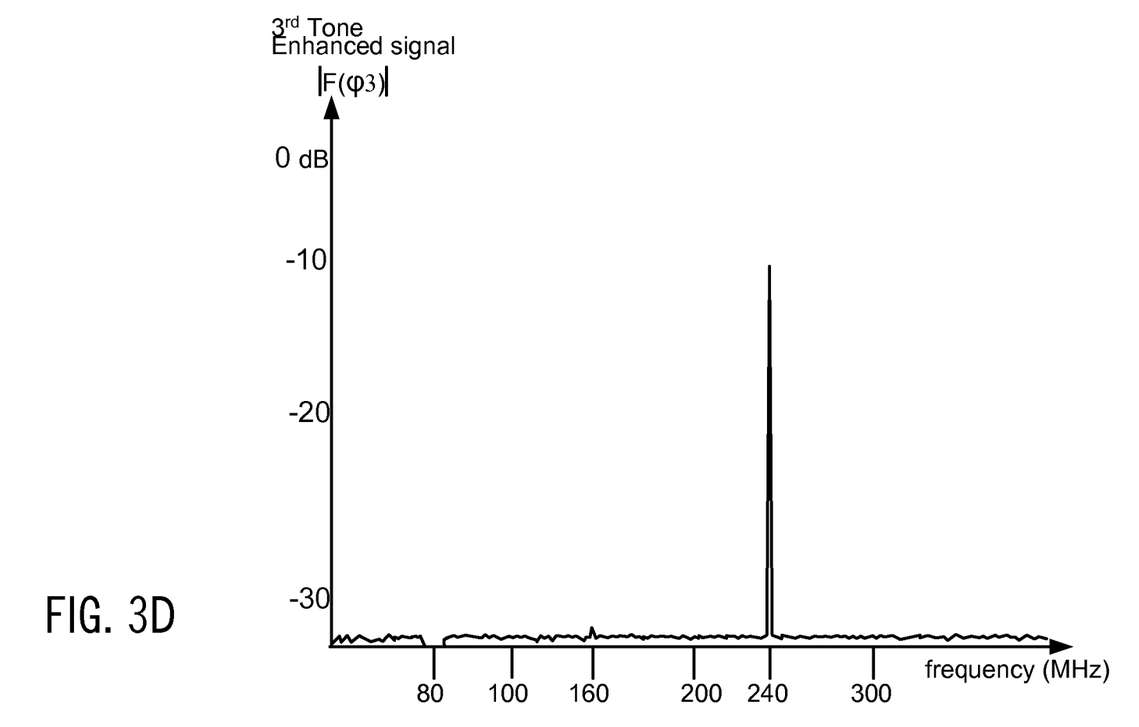
Figure 3E:
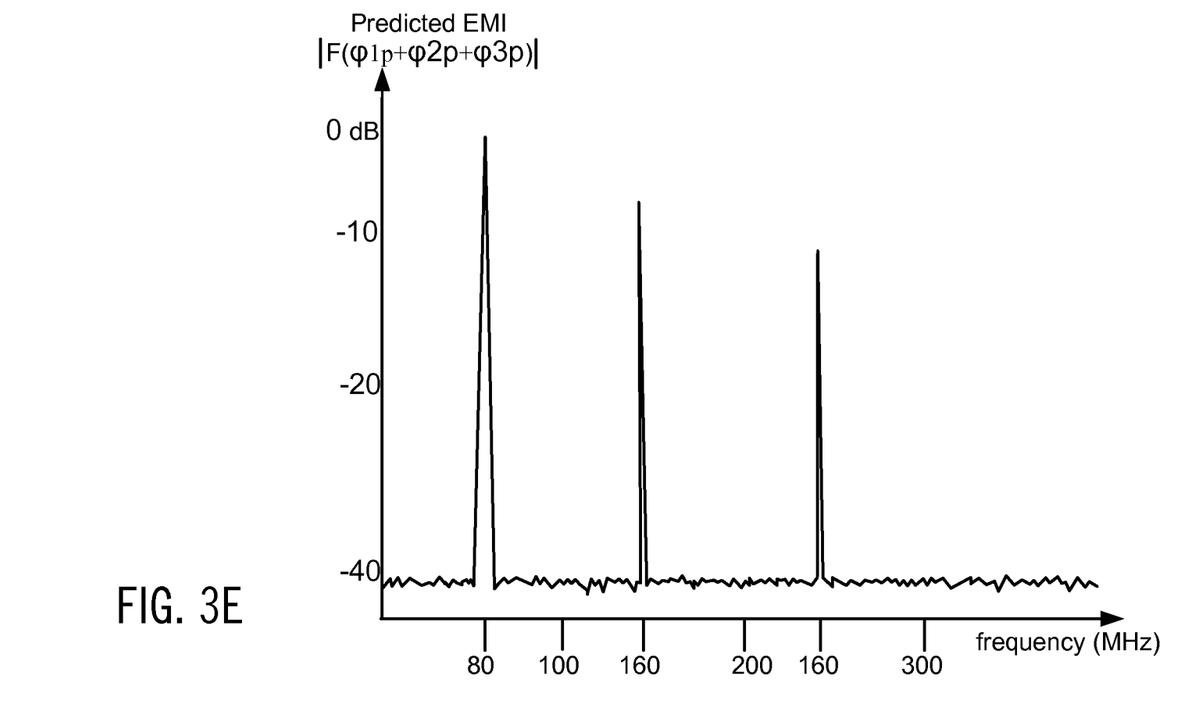

To recapitulate the description so far, circuit 100, buffer 210, tone predictor(s) 211 and 212 operate together as a narrowband interference predictor 220 in accordance with the invention, to track multiple tones of NBI on an input signal on line 111, separate them out, and use the results to predict corresponding tone signals at a current time t, sum them up and supply the summation result as a predicted signal on a line 221. For example, predicted signal $\phi 1p+\phi 2p+\phi 3p$ generated from three-tone NBI embedded in a received signal on line 111 is supplied on line 221 in an illustrative aspect of the invention, as illustrated in FIG. 3E.

In the illustrative aspect of the invention shown in FIG. 2A, the predicted signal on line 221 is used in NBI cancellation, by an arithmetic unit 231. Specifically, arithmetic unit 231 subtracts the three-tone predicted signal $\phi 1p+\phi 2p+\phi 3p$ . . . from a received signal on line 232 (shown at the bottom left of FIG. 2A). Note that the received signal on line 232 is supplied by a first-in-first-out (FIFO) memory 233 coupled to a front end processor 234 that in turn is coupled to a hybrid 235 that in turn is coupled to a cable containing one or more twisted pairs of wires.

Moreover, a result generated by arithmetic unit 231 is supplied (either directly or indirectly) to a decoder 236 for decoding, and the decoded result is then supplied to a media access controller (MAC) 237 for further processing in conformance with a predetermined communication protocol, such as Ethernet. Furthermore, in an illustrative aspect of the invention, decoder 236 is implemented as an iterative decoder that uses low density parity check (LDPC) codes. Depending on various aspects of the invention, front end processor 234, hybrid 235, decoder 236 and MAC 237 can be configured and operated in many different ways, as would be readily apparent to the skilled artisan, in view of this disclosure.

Note that the word "coupled" is used herein to mean connected, either directly or indirectly through one or more circuits. Therefore, in the immediately preceding paragraph, front end processor 234 being coupled to hybrid 235 means either a direct connection therebetween or an indirect connection through other circuit(s).

In some aspects of the invention, the received signal on line 232 is supplied as the input signal on line 111, and therefore, adaptive circuit 100, tone predictor(s) 211, 212, and arithmetic unit 231, are operable in combination with one another as a feed-forward narrowband interference predictor in certain aspects of the invention, wherein the received signal is supplied as the input signal of the adaptive circuit.

In many aspects of the invention, the result from arithmetic unit 231 (also called "first" arithmetic unit) is supplied to a slicer 238 that slices the result, yielding a sliced signal that in turn is supplied to a switch 239. Slicer 238 may be configured and operated in many different ways, as would be readily apparent to the skilled artisan, in view of this disclosure. In an illustrative aspect of the invention, slicer 238 is configured to generate a modulated (e.g. PAM) signal, as the sliced signal. For example, slicer 238 may be implemented as described in U.S. Pat. No. 7,580,482, that is incorporated by reference herein in its entirety.

Referring to FIG. 2A, switch 239 when closed, supplies its output to an additional arithmetic unit 240 (also called "second" arithmetic unit) that in turn subtracts the sliced signal from the received signal, to generate a signal on line 111 that forms the input signal of adaptive circuit 100. Accordingly, slicer 238, switch 239, the first and second arithmetic units 231 and 240, tone predictors 211, 212, buffer 210 and adaptive circuit 100 are operable in combination as a feedback narrowband interference predictor in some aspects of the invention. Note that when switch 239 is opened, the just-described combination reverts to operation as the above-described feed-forward narrowband interference predictor.

Figure 2B:
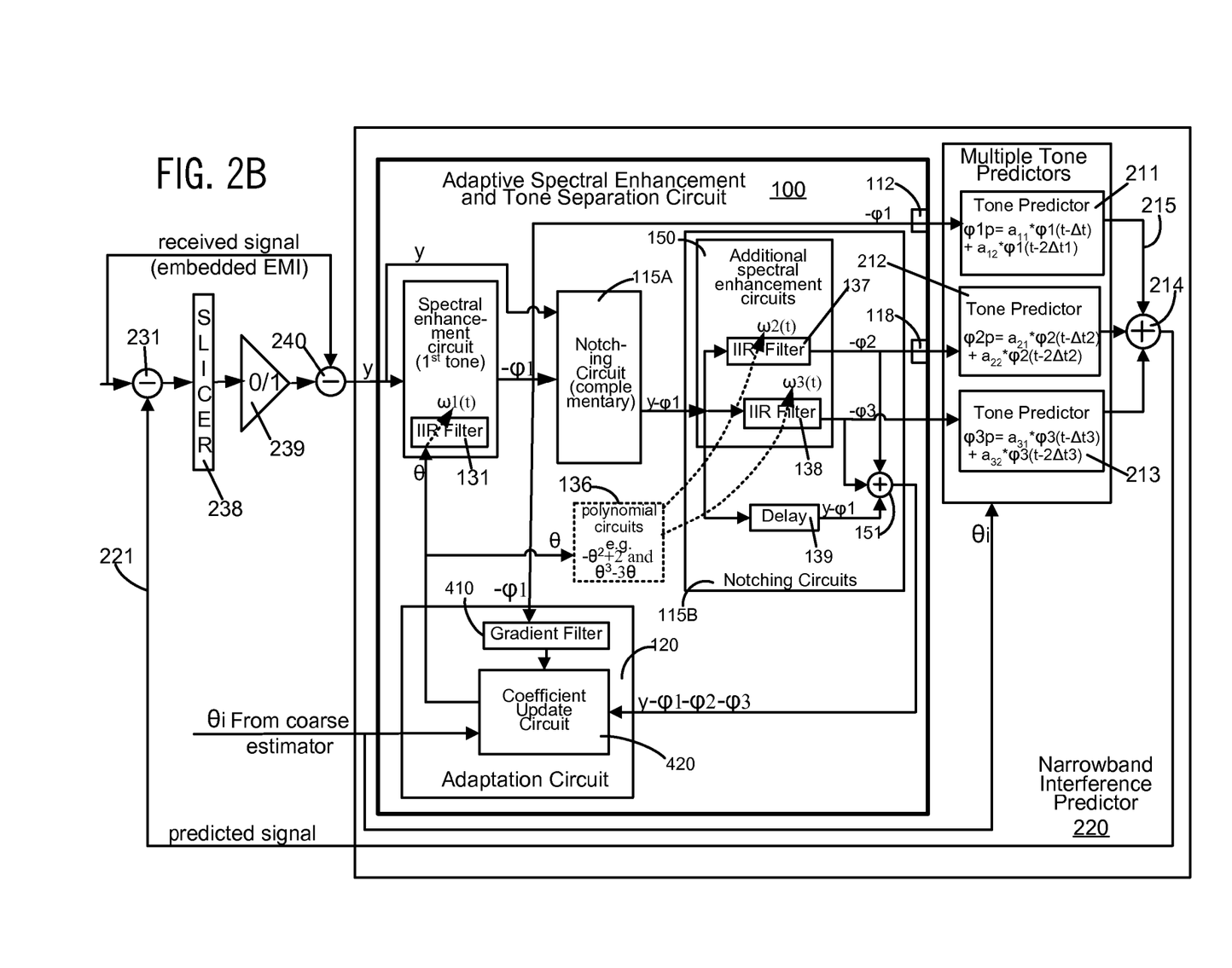
FIG. 2B illustrates, in an intermediate-level block diagram, circuit 100 of FIG. 2A in certain aspects of the invention.

In some aspects of the invention, adaptive circuit 100 of FIG. 2A is implemented as illustrated in FIG. 2B, and described in detail in the concurrently filed, co-owned patent application entitled "Adaptive Spectral Enhancement and Harmonic Separation" filed by Dariush Dabiri, Ser. No. 12/952,178, which is incorporated by reference herein in its entirety. Specifically, in an illustrative aspect of the invention, adaptive circuit 100 (FIG. 2B) includes three IIR filters 131, 137 and 138 each of which is used to perform spectral enhancement and tone separation to generate portions $-\phi 1$, $-\phi 2$ and $-\phi 3$ of the NBI signal.

Note that portions $-\phi 2$ and $-\phi 3$ are obtained by respective filters 137 and 138 operating at respective frequencies $\omega 2$ and $\omega 3$ to enhance a first tone notched signal $y-\phi 1$, or a version thereof scaled by $(1/\rho)$ wherein $\rho$ is the bandwidth. First tone notched signal $y-\phi 1$ is generated by a notching circuit 115A that receives input signal y and an enhanced portion $-\phi 1$ (see FIG. 3A), wherein $-\phi 1$ is generated by IIR filter 131 (by enhancing the input signal y at a center frequency $\omega 1$ identified by coefficient signal $\theta$). Therefore, IIR filters 137 and 138 constitute additional spectral enhancement circuits 150 that generate respective portions $-\phi 2$ (FIG. 3C) and $-\phi 3$ (FIG. 3D) of the NBI signal, supplied to tone predictors 212 and 213. Note that these portions $-\phi 2$ and $-\phi 3$ are added by an arithmetic unit 151 to a delayed version of signal $y-\phi 1$ to generate a cascaded-notched signal $y-\phi 1-\phi 2-\phi 3$ (or a scaled version thereof). The cascaded-notched signal is supplied as an error signal to an adaptation circuit 120 that is included in circuit 100. The error signal indicates to adaptation circuit 120 how far off estimated frequency $\omega 1$ is from a corresponding actual frequency at which a peak occurs in the frequency spectrum of the NBI in the received signal.

Adaptation circuit 120 includes a gradient filter 410 that receives the enhanced portion $-\phi 1$ generated by IIR filter 131 and a coefficient update circuit 420 that receives the cascaded-notched signal $y-\phi 1-\phi 2-\phi 3$ and generates a coefficient signal 8 used to center the frequency of IIR filter 131. In the illustrative aspect of the invention shown in FIG. 2B, the same signal 8 is also used to center IIR filters 137 and 138, although in other aspects of the invention, other signals 82 and 83 are generated by coefficient update circuit 420 (e.g. if there are three independent frequencies in the NBI). Note that adaptation circuit 120 may be configured and operated in many different ways, as would be readily apparent to the skilled artisan, in view of this disclosure.

Referring to FIG. 2B, each of tone predictors 211-213 is implemented in some aspects of the invention, to perform extrapolation based on a corresponding tone signal in the NBI sampled at various times in the past. Specifically, in one illustrative aspect of the invention, tone predictor 211 computes the predicted tone $\phi 1p$ as follows: $a_{11}*\phi 1(t)+a_{12}*\phi 1(t-\Delta t1)$. Note that in this computation, $\Delta t1$ is the duration of time required for signal propagation, through a loop formed by the adaptive circuit 100, tone predictor 211, arithmetic units 214 and 231, slicer 238, switch 239 and arithmetic unit 240. Therefore, for tone predictor 211 operating at the fundamental frequency, a current portion $\phi 1(t)$ and a time-delayed portion $\phi 1(t-\Delta t1)$ are used to perform an LMS (least mean squared) update.

In several embodiments, a $\Delta t$ that is used for $\phi 2$ and $\phi 3$ is different from $\Delta t1$ used for $\phi 1$ because the time required for signal propagation includes IIR filters 137 and 138 in addition. Hence, corresponding pairs of time-delayed portions φ2(t) and φ2(t−Δt2) for the second harmonic are similarly predicted in tone predictor 212 and time-delayed portions φ3(t) and φ3(t−Δt3) the third harmonic are similarly predicted in tone predictor 213, and these values are used to perform corresponding LMS updates. Note that the equations for φ2(t−Δt2) and φ3(t−Δt3) are same as the equation for φ1(t−Δt1), except that Δt2 and Δt3 are used. Specifically, tone predictor 212 computes the predicted tone φ2p for the second harmonic as follows: $a_{21}*\phi2(t)+a_{22}*\phi2(t-\Delta t2)$ and tone predictor 213 computes the predicted tone φ3p for the third harmonic as follows: $a_{31}*\phi3(t)+a_{32}*\phi3(t-\Delta t2)$.

Figure 4:
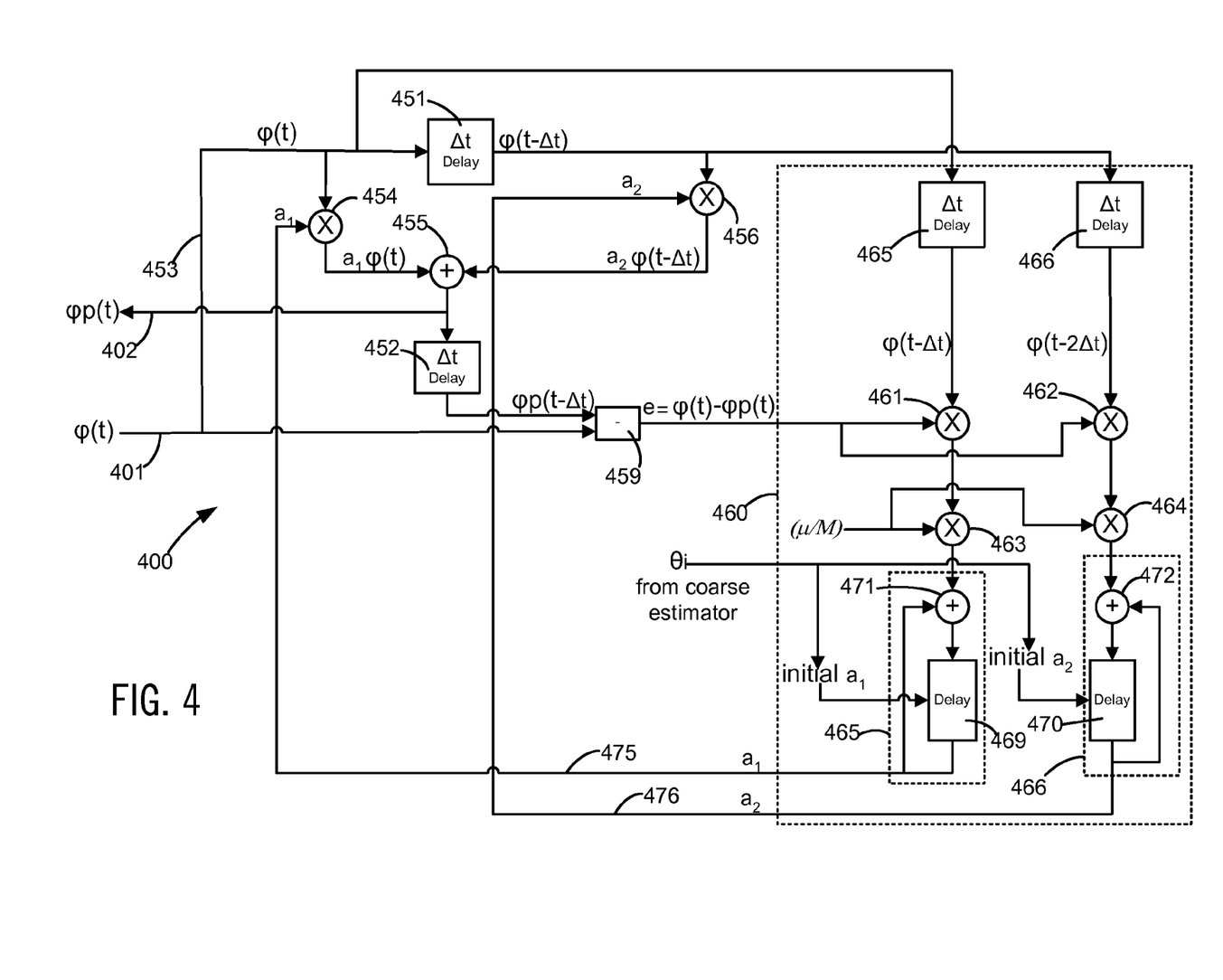
FIG. 4 illustrates, in an low-level block diagram, an illustrative tone predictor of the type used in circuit 110 of FIG. 2A in some aspects of the invention.

The just-described computations (for each of three values of initial subscript namely values 1, 2, 3) are implemented in some aspects of the invention as illustrated in FIG. 4. The circuit in FIG. 4 is shown generically for any one of the three frequencies, e.g. the symbol "φ" in FIG. 4 represents any one of φ1, φ2, and φ3. Accordingly, unless otherwise noted, the following description of tone predictor 400 shown in FIG. 4 describes an implementation of each of the three tone predictors 211, 212 and 213 shown in FIG. 2B. For example, in FIG. 4, a tone predictor 400 has an input line 401 that receives signal φ(t) generated by an IIR filter, e.g. as described above in reference to FIGS. 2A and 2B. Therefore, signal φ in FIG. 4 represents the fundamental-enhanced signal φ1 which is output at port 112, wherein tone predictor 211 of FIG. 2B is implemented by tone predictor 400 of FIG. 4. As another example, signal φ in FIG. 4 represents the second harmonic-enhanced signal φ2 which is output at port 118, in the case wherein tone predictor 212 of FIG. 2B is represented by tone predictor 400 of FIG. 4. Similarly, the symbols $a_{11}$, $a_{12}$ and $a_{13}$ described above in reference to computation of predicted tones, are represented in FIG. 4 without the initial subscript "1", namely as $a_1$ $a_2$ and $a_3$ respectively. In summary, although tone predictor 400 is described generically below, it represents any one of tone predictors 211, 212 and 213.

In tone predictor 400 (FIG. 4) a single tone signal φ(t) received at a current time t on line 401 (e.g. from adaptive spectral enhancement & tone separation circuit 100) is supplied to a multiplier 454 that generates the product $a_1*\phi(t)$. The single tone signal φ(t) on line 401 is also supplied to a delay element 451 that supplies as its output a delayed signal φ(t−Δt). Delayed signal φ(t−Δt) is in turn supplied to another multiplier 456 that generates the product $a_2*\phi(t-\Delta t)$. These two products are input to a summer 455 that generates the sum $a_1*\phi(t)+a_2*\phi(t-\Delta t)$ which in turn is supplied on an output line 402 as the predicted tone signal φp(t). Note that the predicted tone signal φp(t) is an estimate of φ at a time Δt in future (relative to current time t).

As illustrated in FIG. 4, predicted tone signal φp(t) is supplied to a delay element 452, so as to generate φp(t−Δt), as the estimate of φ at current time t. A difference "e" between the predicted value φp and the actual value φ both at the current time is then used to generate scaling factors $a_1$ and $a_2$ that are used in the next iteration by multipliers 454 and 456 as described above. Specifically, a subtractor 459 receives signal φp(t−Δt) from a delay block 452 and also receives signal φ(t) from input line 401 and generates error signal e, which is supplied to an LMS update circuit 460. LMS update circuit 460 uses error signal e to generate the value $a_1$ to be used in a next iteration as follows: $a_1+e*[\phi(t-\Delta t)]*(\mu/M)$, wherein M is the power of φ(t) and μ is a predetermined constant, which can be different in different aspects of the invention, e.g. ½ or ¼. Similarly, LMS update circuit 460 also generates the value $a_2$ for the next iteration as follows: $a_2+\mu*e*[\phi(t-2\Delta t)]/M$.

Specifically LMS update circuit 460 includes delay elements 465 and 466 that respectively receive the signals φ(t) and φ(t−Δt) from input line 401 and delay element 451. LMS update circuit 460 also includes multipliers 461 and 462 that respectively receive signals φ(t−Δt) and φ(t−2Δt) from delay elements 465 and 466 and generate the products $e*\phi(t-\Delta t)$ and $e*\phi(t-2\Delta t)$ respectively which are in turn supplied to multipliers 463 and 464. Multipliers 463 and 464 scale the products $e*\phi(t-\Delta t)$ and $e*\phi(t-2\Delta t)$ with a scaling factor (μ/M) which is an input to LMS update circuit 460. The specific scaling factor and the manner in which it is generated for use by multipliers 463 and 464 is different in different aspects of the invention. Hence, computation of the scaling factor is not further described herein, as it will be readily apparent to the skilled artisan in view of this disclosure. In tone predictor 400 shown in FIG. 4, multipliers 463 and 464 generate and supply the respective products $(\mu/M)*e*\phi(t-\Delta t)$ and $(\mu/M)*e*\phi(t-2\Delta t)$ to accumulators 465 and 466.

Accumulator 456 includes an adder 471 that receives the product $(\mu/M)*e*\phi(t-\Delta t)$ and adds to it a value of $a_1$ used in the immediately preceding iteration, and supplies the sum to a delay element 469. The value of $a_1$ for the next iteration is supplied by delay element 469 on a line 475 that is coupled to the above-described multiplier 454. Similarly, accumulator 466 includes an adder 472 that receives the $(\mu/M)*e*\phi(t-2\Delta t)$ and adds to it a value of $a_2$ from the immediately preceding iteration, and supplies the sum to delay element 470. The value of $a_2$ for the next iteration is supplied by delay element 470 on a line 476 that is coupled to the above-described multiplier 456.

Accumulators 456 and 466 are initialized with corresponding initial values of $a_1$ and $a_2$ that are computed based on a coefficient θi which is generated by a coarse frequency estimator, as an initial estimate of the fundamental frequency of NBI. The initial values of $a_1$ and $a_2$ can be computed in different ways in different aspects of the invention. For example, in one illustrative implementation, a2 is set to 1 as the initial value, and a1 is computed as $-2*\cos\theta i$ wherein θi is an estimate (as described above) of the normalized NBI frequency, in radians. Computation of initial values of $a_1$ and $a_2$ is not further described herein, as it will be readily apparent to the skilled artisan in view of this disclosure.

Although linear extrapolation is used in some aspects of the invention, other types of extrapolation (e.g. quadratic) may be used in other aspects of the invention.

In one illustrative aspect of the invention, the narrowband interference predictor 220 of FIG. 2A is used in an NBI canceler (FIG. 5B) for predicting NBI in a signal that is received by an Ethernet receiver that interfaces with a twisted pair of copper wires carrying an Ethernet signal, for example at a speed of 10 gigabits per second.

Figure 5:
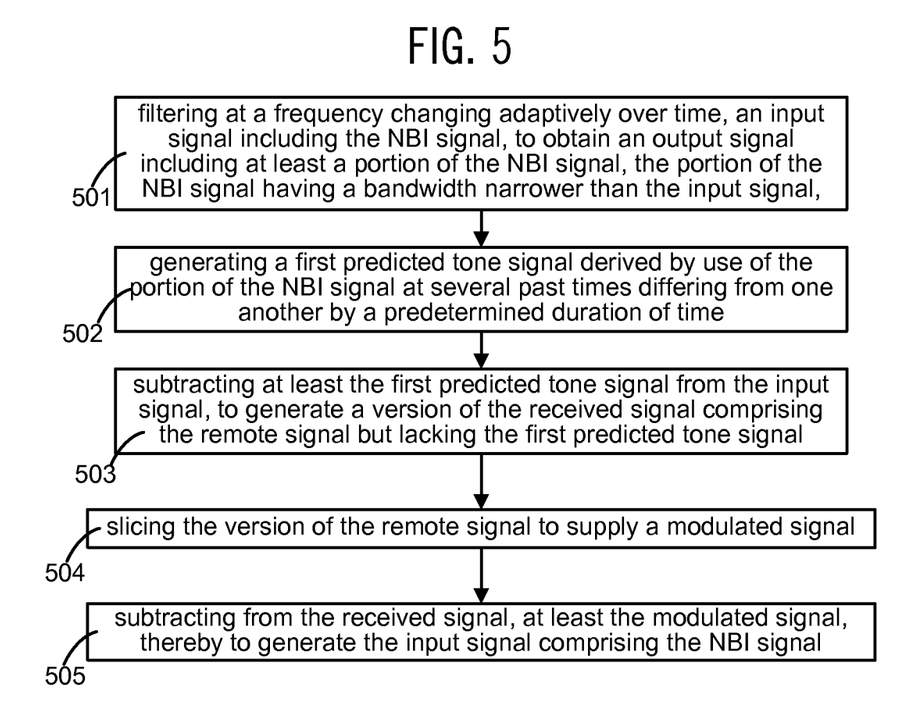
FIG. 5 illustrates a method performed in some aspects of the invention.

In some embodiments of the invention, perform a method (see FIG. 5) for processing a received signal that includes a narrowband interference (NBI) signal and a remote signal as follows: filtering (see act 501) at a frequency changing adaptively over time, an input signal including the NBI signal, to obtain an output signal including at least a portion of the NBI signal, the portion of the NBI signal having a bandwidth narrower than the input signal, generating (see act 502) a first predicted tone signal derived by use of the portion of the NBI signal at several past times differing from one another by a predetermined duration of time, subtracting (see act 503) at least the first predicted tone signal from the input signal, to generate a version of the received signal comprising the remote signal but lacking the first predicted tone signal, slicing (see act 504) the version of the remote signal to supply a modulated signal and subtracting (see act 505) from the received signal, at least the modulated signal, thereby to generate the input signal comprising the NBI signal.

Embodiments of the type described herein may be used to implement 10 GBASE-T PHYs of the type described in a Preliminary Product Brief document entitled "Triveni Dual/ Quad Port 10 GBASE-T PHY" published July 2010 by AMCC that is incorporated by reference herein in its entirety, and available at the following address on the Internet, wherein forward slash has been replaced by "%" sign. http:%%www.appliedmicro.com%MyAMCC%retrieve-Document%MXD%TechDocs%AP M9xxxx% APM96892_93_94_95%APM96892_93_94_95_Triveni_PB2162.pdf One or more circuits and/or methods described herein may be implemented and/or performed in various ways. For example, one or more features and/or circuit elements and/or method steps/acts described above and/or illustrated in FIGS. 2A, 2B, 3A-3E, 4, and 5 may be implemented in hardware, firmware, software, or a combination thereof. For several implementations, one or more features and/or circuit elements and/or method steps/acts described above and/or illustrated in the just-described figures may be used and/or implemented within specific hardware, e.g. one or more application specific integrated circuits (ASICs), digital signal processors (DSPs), programmable logic devices (PLDs), field programmable gate arrays (FPGAs), processors, controllers, microcontrollers, microprocessors, electronic devices, circuits and systems designed to perform the functions described herein, or a combination thereof. For certain implementations, one or more features and/or circuit elements and/or method steps/acts described above and/or illustrated in the just-described figures may be implemented with modules (e.g., procedures, functions, and so on) that perform the functions described herein by use of software and/or firmware executing in hardware of the type just described in the previous sentence. Additionally, any non-transitory machine readable medium tangibly embodying instructions may be used in implementing one or more features and/or circuit elements and/or method steps/acts described above and/or illustrated in the above-described figures. Also, as used herein the terms "memory" and "storage element" refer to any type of long term, short term, volatile (e.g. DRAM), nonvolatile (e.g. SRAM), flip-flop, latch, or other memory that is non-transitory and accessible by any circuitry, such as a processor.

Therefore, numerous modifications and adaptations of the embodiments and aspects described herein will become apparent to the skilled artisan in view of this disclosure. Numerous modifications and adaptations of the embodiments and aspects described herein are encompassed by the scope of the invention.

What is claimed is:

1. A receiver to process a received signal, the receiver comprising:
an adaptive circuit operable to receive an input signal comprising a narrowband interference (NBI) signal, the adaptive circuit further operable to supply an output signal comprising at least a portion of the NBI signal filtered at a first, frequency changing adaptively over time, said portion of the NBI signal having a bandwidth narrower than the input signal, and wherein the adaptive circuit is operable to supply a second output signal comprising a second portion of the NBI signal having a second frequency;
a first tone predictor coupled to the adaptive circuit to receive the output signal, the first tone predictor having a first tone prediction line to supply thereon a first predicted tone signal derived by use of said portion of the NBI signal at a plurality of past times differing from one another by a predetermined duration of time;
a second tone predictor operable to receive the second output signal, the second tone predictor having a second tone prediction line to supply thereon a second predicted tone signal derived from another portion of the NBI signal;
a first arithmetic unit operable to receive said received signal, the first arithmetic unit subtracting from the received signal a sum of the first predicted tone signal and the second predicted tone signal, to generate a version of the received signal comprising a remote signal but lacking the first predicted tone signal and the second predicted tone signal;
a slicer coupled to the first arithmetic unit, the slicer operable to supply a modulated signal obtained by slicing said version of the remote signal, received from the first arithmetic unit;
a second arithmetic unit coupled to the adaptive circuit to supply thereto said input signal comprising the NBI signal, the second arithmetic unit being further coupled to the slicer to receive therefrom the modulated signal, and the second arithmetic unit operable to receive said received signal, the second arithmetic unit subtracting from the received signal, at least the modulated signal, thereby to generate said input signal comprising the NBI signal; and
a third arithmetic unit coupled to the first tone prediction line and the second tone prediction line, the third arithmetic unit coupled to the first arithmetic unit, the third arithmetic unit supplying to the first arithmetic unit the sum of the first predicted tone signal and the second predicted tone signal.

2. The receiver of claim 1 wherein: the adaptive circuit comprises a spectral enhancement circuit.

3. The receiver of claim 1 wherein the duration of time required for signal propagation, through a loop formed by the adaptive circuit, the first tone predictor, the first arithmetic unit, the slicer, and the second arithmetic unit, is hereinafter $\Delta t$, and wherein the first tone predictor comprises:
a sequence of delay elements and a plurality of taps to supply said portion of the NBI signal, at a corresponding plurality of past times; and
a Least Mean Squared (LMS) engine to supply a plurality of coefficients based on an actual sample $\phi(t)$ of the received signal at a current time t and an estimated sample $\phi'(t)$ at the current time t; and
a third arithmetic unit coupled to said taps in the delay line to receive the first portion of the NBI signal at said plurality of past times, the third arithmetic unit being further coupled to the LMS engine to receive the plurality of coefficients, wherein the third arithmetic unit supplies on the first tone prediction line, the estimated sample $\phi'(t)$ at the current time t.

4. The receiver of claim 1 wherein the duration of time required for signal propagation, through a loop formed by the adaptive circuit, the first tone predictor, the first arithmetic unit, the slicer, and the second arithmetic unit, is hereinafter $\Delta t$, and wherein the first tone predictor comprises:
a sequence of delay elements and a pair of taps to supply said portion of the NBI signal (1) at a first past time $(t-\Delta t)$ and (2) at a second past time $(t-2\Delta t)$; a Least Mean Squared (LMS) engine to supply a pair of coefficients a11 and a12 based on an actual sample $\phi(t)$ at a current time t and an estimated sample $\phi'(t)$ at the current time t; and a third arithmetic unit coupled to said pair of taps in the delay line to receive the first portions $\phi(t-\Delta t)$ and $\phi(t-2\Delta t)$ of the NBI signals at said first past time and said second past time, the third arithmetic unit being further coupled to the LMS engine to receive the pair of coefficients a11 and a12, wherein the third arithmetic unit supplies on the first tone prediction line: $\phi'(t)=a11*\phi(t-\Delta t)+a12*\phi(t-2\Delta t)$.

5. The receiver of claim 1 wherein: the second frequency is a harmonic of the first frequency.

6. The receiver of claim 5 wherein:
the adaptive circuit comprises a first infinite impulse response (IIR) filter centered at the first frequency and the adaptive circuit further comprises a second IIR filter centered at the second frequency.

7. The receiver of claim 1 wherein the adaptive circuit further comprises:
a fourth arithmetic unit coupled to each of the first tone prediction line and the second tone prediction line;
a coefficient update circuit coupled to the fourth arithmetic unit, the coefficient update circuit generating a coefficient signal indicative of said frequency; and
a gradient filter coupled to the coefficient update circuit, the gradient filter receiving said portion of the NBI signal.

8. A method for processing a received signal comprising a narrowband interference (NBI) signal and a remote signal, the method comprising:
filtering at a first frequency changing adaptively over time, an input signal comprising the NBI signal, to obtain an output signal comprising at least a first portion of the NBI signal, said first portion of the NBI signal having a bandwidth narrower than the input signal;
supplying a second output signal comprising a second portion of the NBI signal comprising a second frequency;
generating a first predicted tone signal derived by use of said first portion of the NBI signal at a plurality of past times differing from one another by a predetermined duration of time;
generating a second predicted tone signal derived from said second portion of the NBI signal;
subtracting the first predicted tone signal and the second predicted tone signal from the received signal, to generate a version of the received signal comprising the remote signal but lacking the first and second predicted tone signals;
slicing said version of the remote signal to supply a modulated signal; and
subtracting from the received signal, at least the modulated signal, thereby to generate said input signal comprising the NBI signal.

9. The method of claim 8 wherein the second frequency is a harmonic of the first frequency.

10. The method of claim 8 further comprising:
generating a plurality of predicted tone signals derived from a plurality of respective portions of the NBI signal, wherein a quantity of predicted tone signals will be generated depending on a quantity of frequencies of NBI.

11. The method of claim 8, wherein said filtering is performed with an infinite impulse response (IIR) filter centered at the first frequency, and wherein said filtering performs spectral enhancement and tone separation to generate the first portion of the NBI signal.

12. The method of claim 8, wherein the method for processing the received signal comprising the NBI signal and the remote signal is performed by one of hardware, firmware, software, or a combination thereof.

13. A receiver to process a received signal comprising a narrowband interference (NBI) signal and a remote signal, the receiver comprising:
means for filtering at a frequency changing adaptively over time, an input signal comprising the NBI signal, to obtain an output signal comprising at least a portion of the NBI signal, said portion of the NBI signal having a bandwidth narrower than the input signal;
a means for supplying a second output signal comprising a second portion of the NBI signal comprising a second frequency;
means for generating a first predicted tone signal derived by use of said portion of the NBI signal at a plurality of past times differing from one another by a predetermined duration of time;
a means for generating a second predicted tone signal derived from said second portion of the NBI signal;
means for subtracting the first and second predicted tone signals from the received signal, to generate a version of the received signal comprising the remote signal but lacking the first and second predicted tone signals;
means for slicing said version of the remote signal to supply a modulated signal; and
means for subtracting from the received signal, at least the modulated signal, thereby to generate said input signal comprising the NBI signal.

14. The receiver of claim 13, wherein the second frequency is a harmonic of the first frequency.

15. The receiver of claim 13 further comprising:
a means for generating a plurality of predicted tone signals derived from a plurality of respective portions of the NBI signal, wherein a quantity of predicted tone signals will be generated depending on a quantity of frequencies of NBI.

16. The receiver of claim 13, wherein said means for filtering comprises an infinite impulse response (IIR) filter centered at the first frequency, and wherein said means for filtering comprises a means for spectral enhancement and tone separation to generate the first portion of the NBI signal.

* * * * *